United States Patent
Shafi et al.

(10) Patent No.: US 8,728,920 B2
(45) Date of Patent: May 20, 2014

(54) SCHOTTKY DIODE WITH CONTROL GATE FOR OPTIMIZATION OF THE ON STATE RESISTANCE, THE REVERSE LEAKAGE, AND THE REVERSE BREAKDOWN

(75) Inventors: Zia Alan Shafi, Boise, ID (US); Jeffrey A. Babcock, Santa Clara, CA (US)

(73) Assignee: National Semiconductor Corporation, Santa Clara, CA (US)

(*) Notice: Subject to any disclaimer, the term of this patent is extended or adjusted under 35 U.S.C. 154(b) by 159 days.

(21) Appl. No.: 13/486,166

(22) Filed: Jun. 1, 2012

(65) Prior Publication Data

US 2012/0244689 A1    Sep. 27, 2012

Related U.S. Application Data

(62) Division of application No. 12/763,287, filed on Apr. 20, 2010, now Pat. No. 8,193,602.

(51) Int. Cl.
*H01L 21/425* (2006.01)

(52) U.S. Cl.
USPC ........................................... 438/534

(58) Field of Classification Search
CPC .............. H01L 29/0692; H01L 29/872; H01L 21/0495; H01L 21/0435; H01L 21/28537

USPC .................. 438/510, 514, 523, 526, 533, 534
See application file for complete search history.

(56) References Cited

U.S. PATENT DOCUMENTS

| | | | | |
|---|---|---|---|---|
| 4,862,244 | A * | 8/1989 | Yamagishi | 257/484 |
| 6,255,227 | B1 * | 7/2001 | Donaton et al. | 438/745 |
| 6,399,413 | B1 * | 6/2002 | Krutsick | 438/92 |
| 6,784,489 | B1 * | 8/2004 | Menegoli | 257/343 |
| 2005/0139860 | A1 * | 6/2005 | Snyder et al. | 257/155 |
| 2006/0125019 | A1 * | 6/2006 | Levin et al. | 257/369 |
| 2006/0244050 | A1 * | 11/2006 | Sudou | 257/324 |
| 2008/0006899 | A1 * | 1/2008 | Kim et al. | 257/476 |
| 2008/0135970 | A1 * | 6/2008 | Kim et al. | 257/471 |
| 2010/0032731 | A1 * | 2/2010 | Babcock et al. | 257/280 |

* cited by examiner

*Primary Examiner* — Nikolay Yushin
(74) *Attorney, Agent, or Firm* — Wade J. Brady, III; Frederick J. Telecky, Jr.

(57) ABSTRACT

A Schottky diode optimizes the on state resistance, the reverse leakage current, and the reverse breakdown voltage of the Schottky diode by forming an insulated control gate over a region that lies between the metal-silicon junction of the Schottky diode and the n+ cathode contact of the Schottky diode.

7 Claims, 9 Drawing Sheets

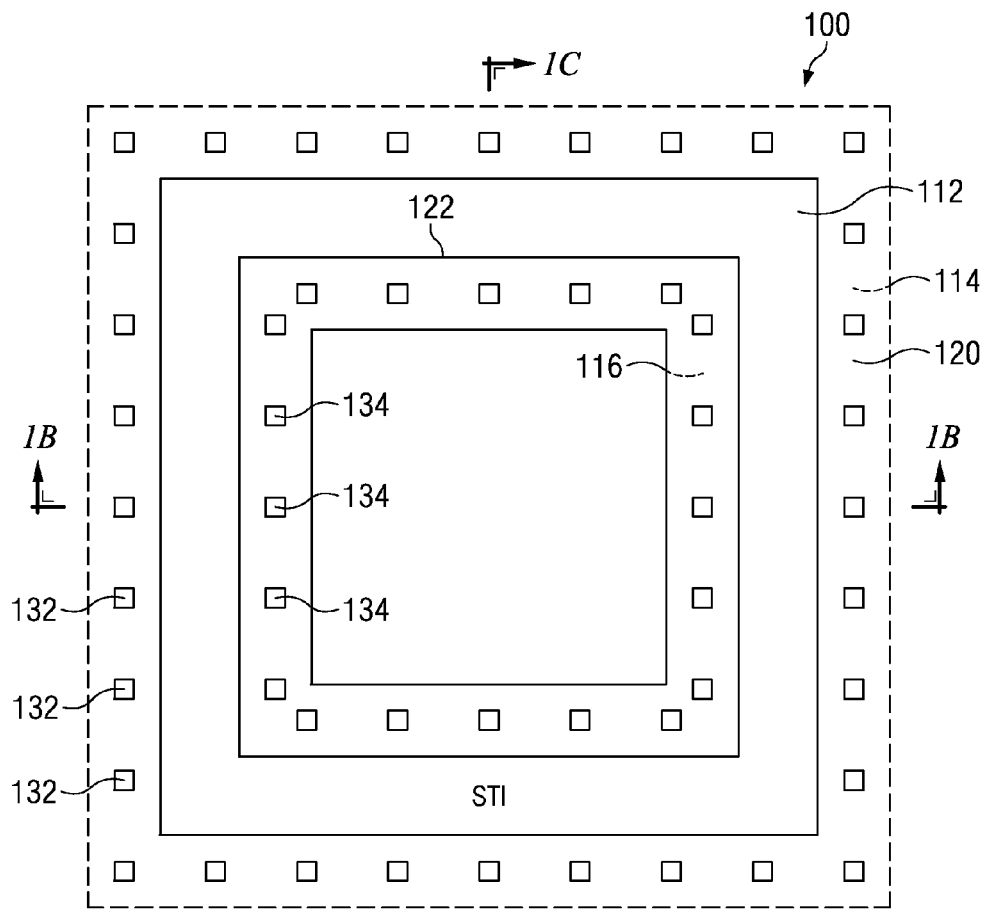
FIG. 1A *(PRIOR ART)*
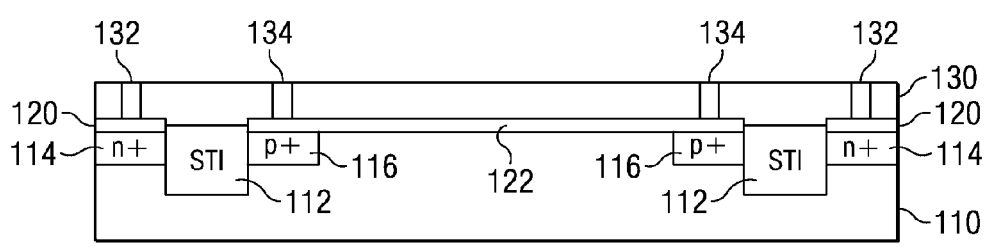
FIG. 1B *(PRIOR ART)*
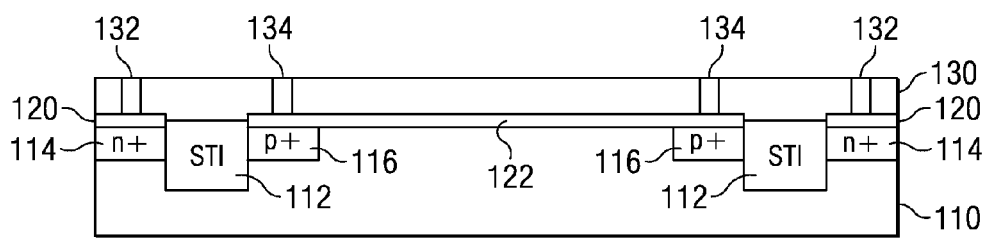
FIG. 1C *(PRIOR ART)*

SCHOTTKY DIODE WITH CONTROL GATE FOR OPTIMIZATION OF THE ON STATE RESISTANCE, THE REVERSE LEAKAGE, AND THE REVERSE BREAKDOWN

This application is a division of application Ser. No. 12/763,287 filed Apr. 20, 2010, entitled "SCHOTTKY DIODE WITH CONTROL GATE FOR OPTIMIZATION OF THE ON STATE RESISTANCE, THE REVERSE LEAKAGE, AND THE REVERSE BREAKDOWN", which is hereby incorporated by reference in its entirety for all purposes.

BACKGROUND OF THE INVENTION

1. Field of the Invention

The present invention relates to Schottky diodes and, more particularly, to a Schottky diode with a control gate for optimization of the on state resistance, the reverse leakage current, and the reverse breakdown voltage.

2. Description of the Related Art

A Schottky diode is a well-known structure with a metal-to-silicon junction that functions as a diode. Schottky diodes have a forward voltage drop that is lower than the forward voltage drop of a conventional pn diode (e.g., 0.35V versus 0.7V) and a switching action that is faster than the switching action of a conventional pn diode (e.g., 100 ps versus 100 ns).

FIGS. 1A-1C show views that illustrate an example of a conventional Schottky diode 100. FIG. 1A shows a plan view, FIG. 1B shows a cross-sectional view taken along line 1B-1B of FIG. 1A, and FIG. 1C shows a cross-sectional view taken along line 1C-1C of FIG. 1A. As shown in FIGS. 1A-1C, Schottky diode 100 includes an n-type semiconductor material 110, such as an n-type substrate, epitaxial layer, or well, and a shallow trench isolation (STI) ring 112 that is formed in semiconductor material 110.

As further shown in FIGS. 1A-1C, Schottky diode 100 includes an n+ ring 114 and a p+ guard ring 116 that are formed in semiconductor material 110 on opposite sides of STI ring 112. Schottky diode 100 also includes a metal ring 120 that touches the top surface of n+ ring 114, and a metal region 122 that touches the top surface of semiconductor material 110 and p+ guard ring 116. Metal ring 120 and metal region 122 are commonly formed with a silicide, such as platinum silicide.

In addition, Schottky diode 100 includes a non-conductive layer 130 that touches the top surfaces of the STI region 112, the metal ring 120, and the metal region 122, a number of first contacts 132 that extend through non-conductive layer 130 to make electrical connections with metal ring 120, and a number of second contacts 134 that extend through non-conductive layer 130 to make electrical connections with metal region 122.

In operation, metal region 122 functions as the anode of the diode and semiconductor material 110 functions as the cathode of the diode. In addition, n+ ring 114 functions as the cathode contact, while p+ guard ring 116 reduces the leakage current. As a result, when the voltage applied to metal region 122 rises above the voltage applied to semiconductor material 110 by approximately 0.35V, a current flows from metal region 122 to n+ ring 114. On the other hand, when the voltage applied to metal region 122 falls below the voltage applied to semiconductor material 110, substantially no current flows from n+ ring 114 to metal region 122.

One of the drawbacks of Schottky diodes is that Schottky diodes have a relatively high reverse leakage current when compared to conventional pn diodes. (The reverse leakage current is a small current that flows when the voltage applied to the anode falls below the voltage applied to the cathode.)

Another drawback of Schottky diodes is that Schottky diodes have a relatively low reverse breakdown voltage when compared to conventional pn diodes. (The reverse breakdown voltage is the maximum amount that the voltage applied to the anode can fall below the voltage applied to the cathode before a substantial current flows from the cathode to the anode.) Thus, there is a need for a Schottky diode that has a lower reverse leakage current and a higher reverse breakdown voltage.

BRIEF DESCRIPTION OF THE DRAWINGS

FIGS. 1A-1C are views illustrating an example of a conventional Schottky diode 100. FIG. 1A is a plan view, FIG. 1B is a cross-sectional view taken along line 1B-1B of FIG. 1A, and FIG. 1C is a cross-sectional view taken along line 1C-1C of FIG. 1A.

FIG. 2A is a plan view, FIG. 2B is a cross-sectional view taken along line 2B-2B of FIG. 2A, and FIG. 2C is a cross-sectional view taken along line 2C-2C of FIG. 2A.

FIG. 3A is a plan view, FIG. 3B is a cross-sectional view taken along line 3B-3B of FIG. 3A, and FIG. 3C is a cross-sectional view taken along line 3C-3C of FIG. 3A.

FIG. 4A is a plan view, FIG. 4B is a cross-sectional view taken along line 4B-4B of FIG. 4A, and FIG. 4C is a cross-sectional view taken along line 4B-4B of FIG. 4A.

FIG. 5A is a plan view, FIG. 5B is a cross-sectional view taken along line 5B-5B of FIG. 5A, and FIG. 5C is a cross-sectional view taken along line 5C-5C of FIG. 5A.

FIGS. 6A-6F are taken along line 2B-2B of FIG. 2A, while FIGS. 7A-7F are taken along line 2C-2C of FIG. 2A.

DETAILED DESCRIPTION OF THE INVENTION

Figure 2A:
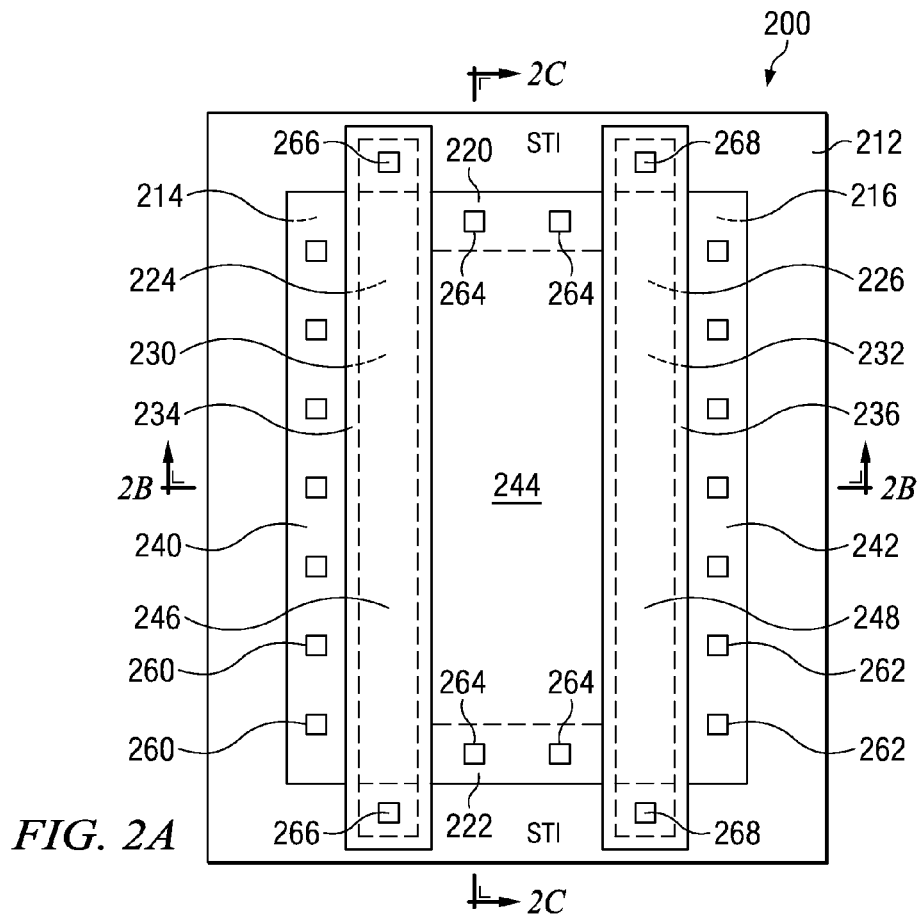
FIGS. 2A-2C are views illustrating an example of a Schottky diode 200 in accordance with the present invention.
Figure 2B:
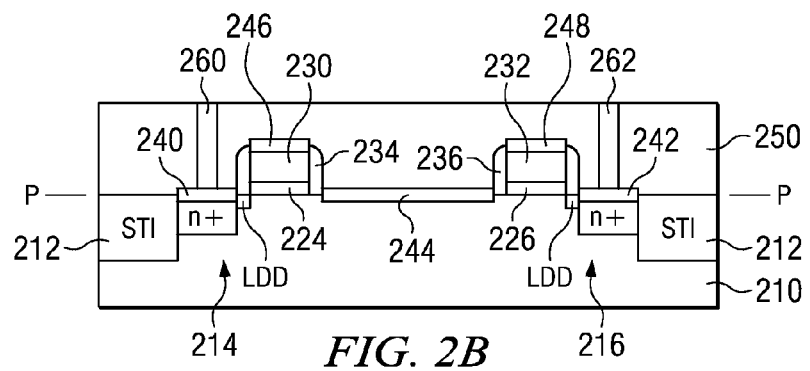
Figure 2C:
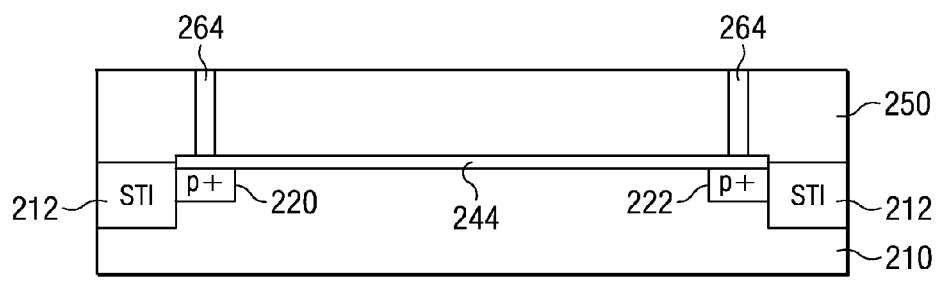

FIGS. 2A-2C show views that illustrate an example of a Schottky diode 200 in accordance with the present invention. FIG. 2A shows a plan view, FIG. 2B shows a cross-sectional view taken along line 2B-2B of FIG. 2A, and FIG. 2C shows a cross-sectional view taken along line 2C-2C of FIG. 2A.

As shown in FIGS. 2A-2C, Schottky diode 200 includes an n-type semiconductor material 210, such as an n-type substrate, epitaxial layer, or well, and a shallow trench isolation (STI) ring 212 that is formed in semiconductor material 210. Schottky diode 200 also includes a first n-type strip 214 and a second n-type region 216 that are formed in semiconductor material 210 to touch a portion of the inner side wall of STI ring 212.

The n-type strips 214 and 216, which each include an n+ region and a low-density drain (LDD) region, are spaced apart and, in the present example, are substantially parallel to each other. As a result, the n-type strips 214 and 216 each has a dopant concentration that is greater than a dopant concentration of semiconductor material 210. Further, no n-type region with a dopant concentration greater than the dopant concentration of semiconductor material 210 touches both n-type strip 214 and n-type strip 216.

As further shown in FIGS. 2A-2C, Schottky diode 200 includes a first p+ region 220 and a second p+ region 222 that are formed in semiconductor material 210 to touch portions of the inner side wall of STI ring 212. The p+ regions 220 and 222 lie laterally between the n-type strips 214 and 216, and are spaced apart such that no p-type region touches both p+ region 220 and p+ region 222.

Further, Schottky diode 200 includes a first non-conductive strip 224 and a second non-conductive strip 226 that touch the top surface of semiconductor material 210. First non-conductive strip 224 and second non-conductive strip 226, which can be implemented with a non-conductive material such as oxide, are spaced apart and lie between the n-type strips 214 and 216.

Schottky diode 200 additionally includes a first conductive strip 230 and a second conductive strip 232 that touch the top surfaces of the first and second non-conductive strips 224 and 226, respectively. First conductive strip 230 and second conductive strip 232, which can be implemented with a conductive material such as doped polysilicon, are spaced apart and lie between the n-type strips 214 and 216.

Further, Schottky diode 200 includes a first non-conductive side wall spacer 234 and a second non-conductive side wall spacer 236 that touch the top surface of semiconductor material 210. Side wall spacer 234 also touches the side walls of non-conductive strip 224 and conductive strip 230, while side wall spacer 236 touches the side walls of non-conductive strip 226 and conductive strip 232.

Schottky diode 200 also includes a metal strip 240 that touches the top surface of n-type strip 214, a metal strip 242 that touches the top surface of n-type strip 216, a metal region 244 that touches the top surface of semiconductor material 210 and the p+ regions 220 and 222, a metal strip 246 that touches the top surface of conductive strip 230, and a metal strip 248 that touches the top surface of conductive strip 232. As shown, metal strip 240, metal strip 242, and metal region 244 lie in a single plane P. The metal strips 240, 242, 246, and 248 and the metal region 244 can be implemented with a silicide, such as cobalt silicide.

In addition, Schottky diode 200 includes a non-conductive layer 250 that touches and overlies the STI ring 212, the side wall spacers 234 and 236, the metal strips 240, 242, 246, and 248, and the metal region 244. Schottky diode 200 also includes a number of first contacts 260, a number of second contacts 262, a number of third contacts 264, a number of fourth contacts 266, and a number of fifth contacts 268.

The number of first contacts 260 extends through non-conductive layer 250 to make electrical connections with metal strip 240, while the number of second contacts 262 extends through non-conductive layer 250 to make electrical connections with metal strip 242. The metal strips 240 and 242 are electrically connected together in the metal interconnect structure.

The number of contacts 264 extends through non-conductive layer 250 to make electrical connections with metal region 244, the number of contacts 266 extends through non-conductive layer 250 to make electrical connections with metal strip 246, and the number of contacts 268 extends through non-conductive layer 250 to make electrical connections with metal strip 248.

In operation, metal region 244 functions as the anode of diode 200 and the semiconductor material 210 functions as the cathode of diode 200. In addition, the n-type strips 214 and 216 function as the cathode contacts, while the p+ regions 220 and 222 reduce leakage current. As a result, when the voltage applied to metal region 244 rises above the voltage applied to semiconductor region 210 by approximately 0.35V, a current flows from metal region 244 to n-type strip 214 and a current flows from metal region 244 to n-type strip 216.

In addition, the p+ regions 220 and 222 and the underlying n-type semiconductor material 210 form pn junctions. As a result, when the voltage applied to metal region 244 rises above the voltage applied to semiconductor region 210 by approximately 0.7V, currents flow from the p+ regions 220 and 222 to the n-type strips 214 and 216. Thus, the Schottky diode 200 turns on before the pn junctions turn on. On the other hand, when the voltage applied to metal region 244 falls below the voltage applied to semiconductor material 210, substantially no current flows from semiconductor material 210 to metal region 244.

In addition, a voltage can be placed on the conductive strips 230 and 232 to modify the operation of diode 200. When a positive voltage is applied to the conductive strips 230 and 232, electrons are attracted to the top surface of semiconductor material 210 directly below the conductive strips 230 and 232. The attracted electrons form channel-type regions that reduce the series resistance and increase the magnitudes of the currents that flow to the n-type strips 214 and 216. Thus, by selecting the magnitude of the positive voltage, the on state resistance of diode 200 can be optimized.

On the other hand, when a negative voltage is applied to the conductive strips 230 and 232, the top surface of semiconductor material 210 directly below the conductive strips 230 and 232 becomes depleted which, in turn, substantially reduces the reverse leakage current and substantially increases the reverse breakdown voltage. Thus, by selecting the magnitude of the negative voltage, the reverse leakage current and the reverse breakdown voltage can be optimized. As a result, one of the advantages of the present invention is that by biasing the conductive strips 230 and 232 the characteristics of diode 200 can be optimized.

Another advantage of the present invention is that the present invention eliminates the formation of the p+ guard ring and the contacts along two sides of the anode (e.g., along the two vertical sides of metal region 122 shown in FIG. 1A). By eliminating the formation of the p+ guard ring and the contacts along two sides of the anode, the width of the diode can be reduced which, in turn, increases the frequency of the voltage that can be applied to the anode.

Figure 3A:
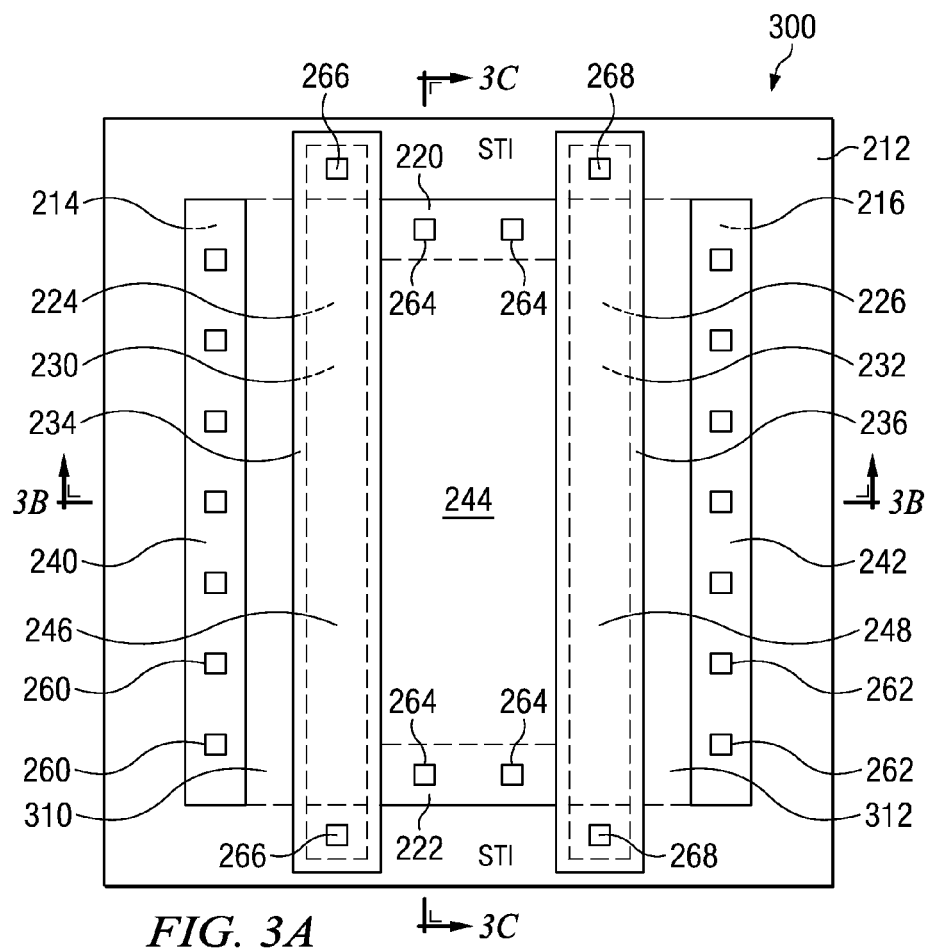
FIGS. 3A-3C are views illustrating an example of a Schottky diode 300 in accordance with a first alternate embodiment of the present invention.
Figure 3B:
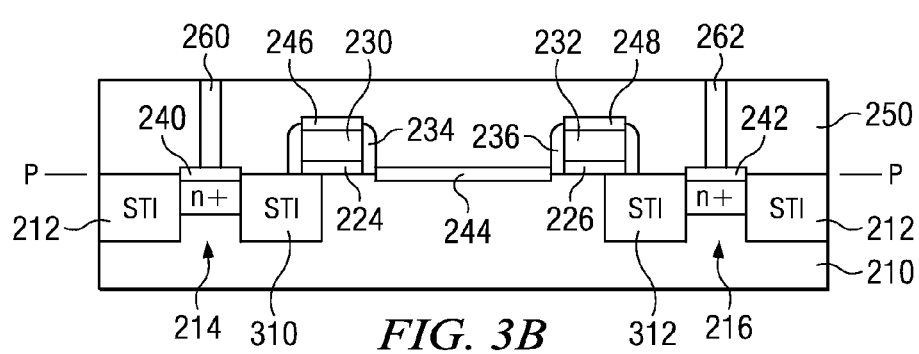
Figure 3C:
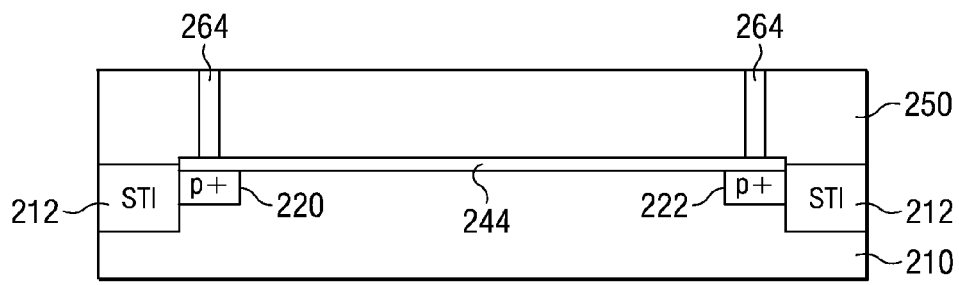

FIGS. 3A-3C show views that illustrate an example of a Schottky diode 300 in accordance with a first alternate embodiment of the present invention. FIG. 3A shows a plan view, FIG. 3B shows a cross-sectional view taken along line 3B-3B of FIG. 3A, and FIG. 3C shows a cross-sectional view taken along line 3C-3C of FIG. 3A. Schottky diode 300 is similar to Schottky diode 200 and, as a result, utilizes the same reference numerals to designate the structures which are common to both diodes.

As shown in FIGS. 3A-3C, diode 300 differs from diode 200 in that diode 300 includes a shallow trench isolation (STI) strip 310 that is formed in semiconductor material 210 to lie partially below conductive strip 230, and an STI strip 312 that is formed in semiconductor material 210 to lie partially below conductive strip 232.

In addition, since the STI strips 310 and 312 lie partially below the conductive strips 230 and 232, the LDD regions of the n-type conductive strips 214 and 216 are eliminated. Schottky diode 300 operates the same as Schottky diode 200 except that the STI strips 310 and 312 further reduce the reverse leakage current and further increase the reverse breakdown voltage of the diode.

Figure 4A:
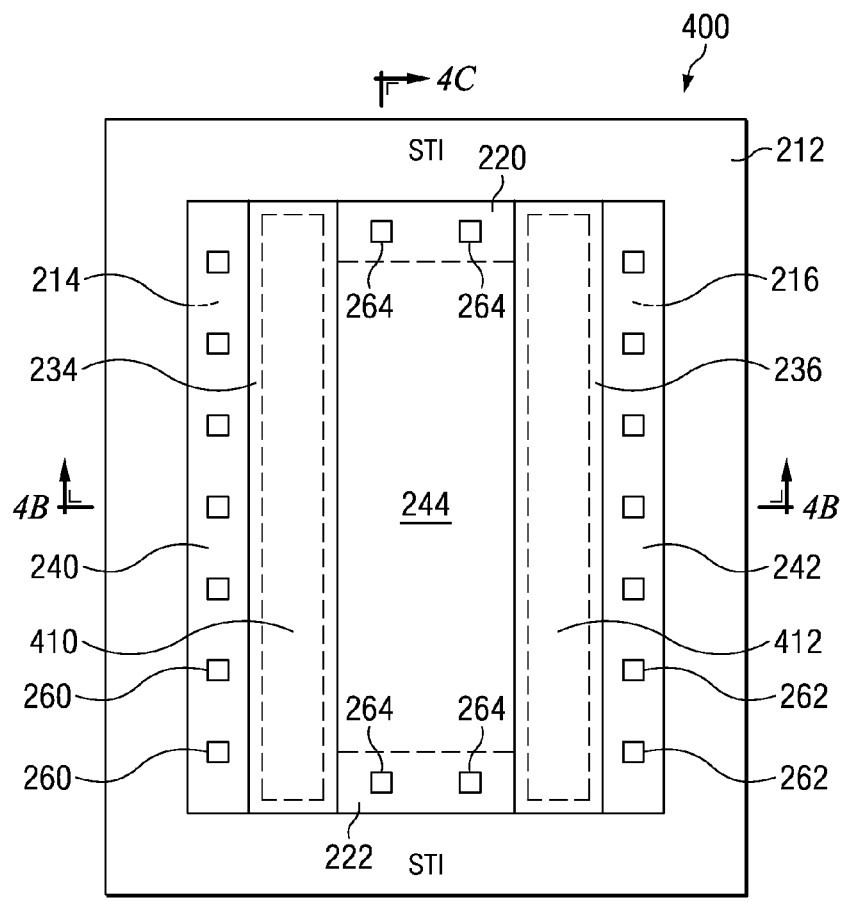
FIGS. 4A-4C are views illustrating an example of a Schottky diode 400 in accordance with a second alternate embodiment of the present invention.
Figure 4B:
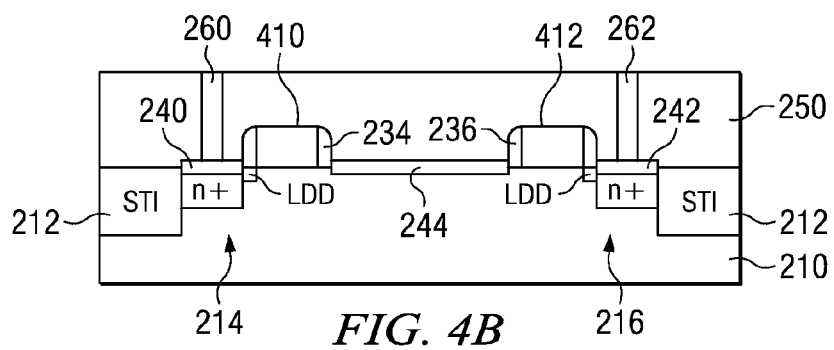
Figure 4C:
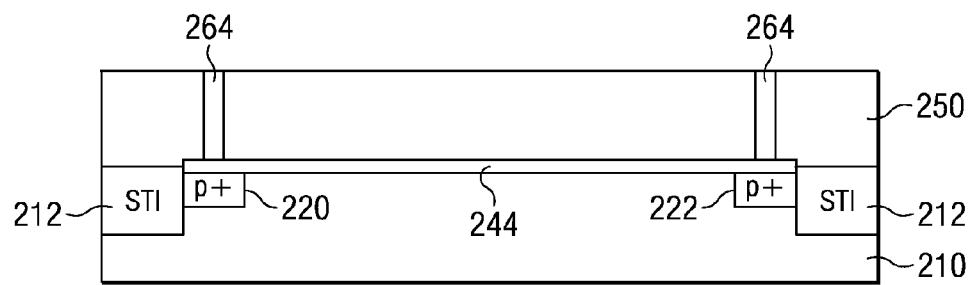

FIGS. 4A-4C show views that illustrate an example of a Schottky diode 400 in accordance with a second alternate embodiment of the present invention. FIG. 4A shows a plan view, FIG. 4B shows a cross-sectional view taken along line 4B-4B of FIG. 4A, and FIG. 4C shows a cross-sectional view taken along line 4C-4C of FIG. 4A. Schottky diode 400 is similar to Schottky diode 200 and, as a result, utilizes the same reference numerals to designate the structures which are common to both diodes.

As shown in FIGS. 4A-4C, diode 400 differs from diode 200 in that diode 400 utilizes a first non-conductive strip 410 in lieu of first non-conductive strip 224 and first conductive strip 230, and a second non-conductive strip 412 in lieu of second non-conductive strip 226 and second conductive strip 232.

As a result, no conductive member lies between non-conductive layer 250 and any portion of first non-conductive strip 410, and no conductive member lies between non-conductive layer 250 and any portion of second non-conductive strip 412. The non-conductive strips 410 and 412 can be implemented with, for example, oxide or oxide and nitride, and are thicker than the non-conductive strips 230 and 232.

Schottky diode 400 operates the same as Schottky diode 200 except that diode 400 does not reduce the reverse leakage current and increase the reverse breakdown voltage. Diode 400 is best utilized in a high-frequency application where a higher reverse leakage current and a lower reverse breakdown voltage are acceptable.

Figure 5A:
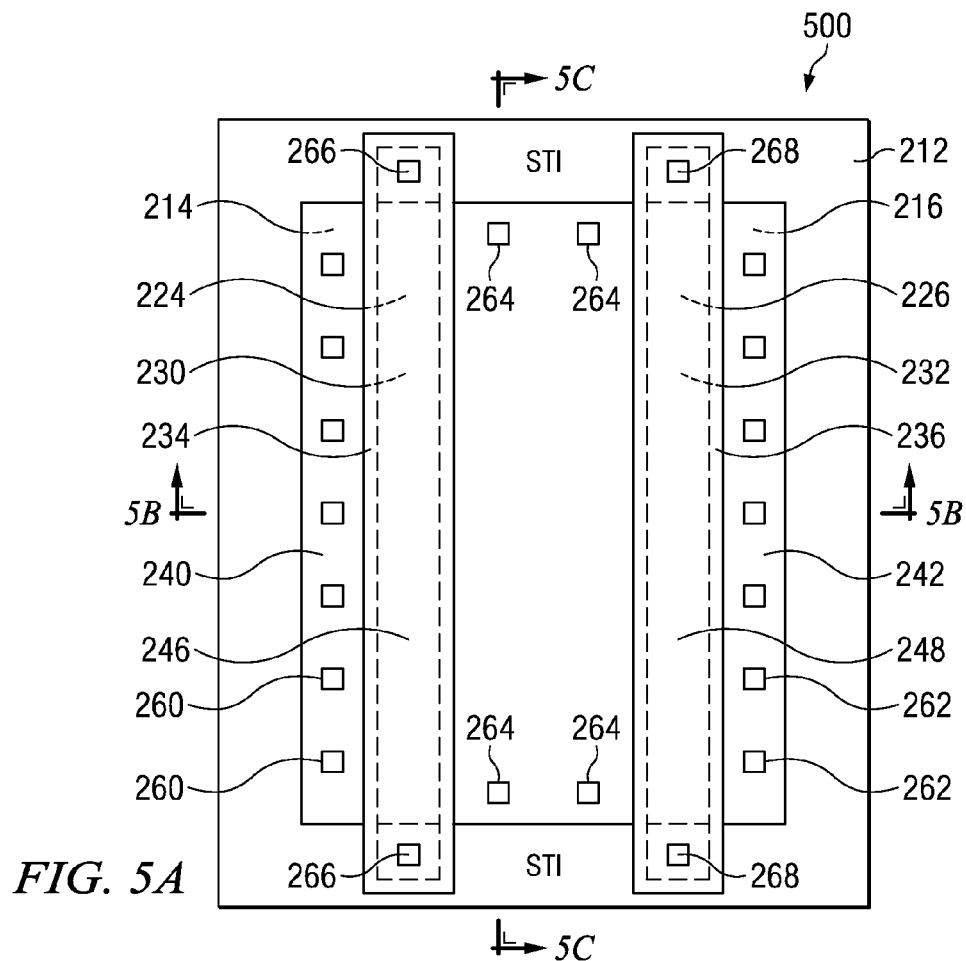
FIGS. 5A-5C are views illustrating an example of a Schottky diode 500 in accordance with a third alternate embodiment of the present invention.
Figure 5B:
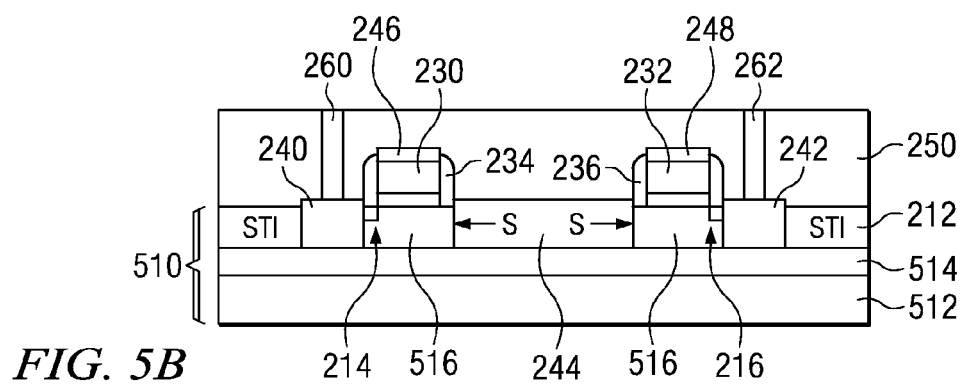
Figure 5C:
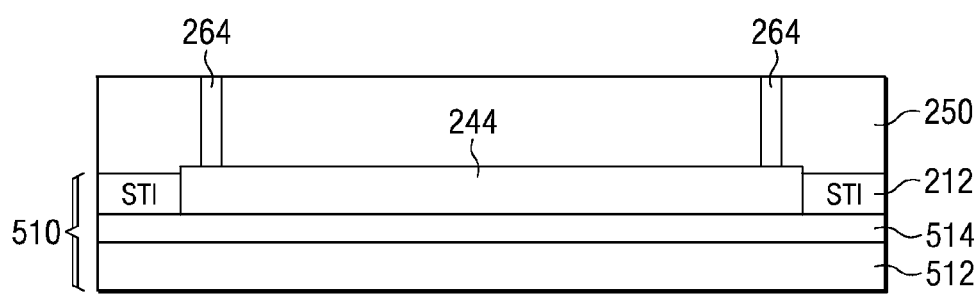

FIGS. 5A-5C show views that illustrate an example of a Schottky diode 500 in accordance with a third alternate embodiment of the present invention. FIG. 5A shows a plan view, FIG. 5B shows a cross-sectional view taken along line 5B-5B of FIG. 5A, and FIG. 5C shows a cross-sectional view taken along line 5C-5C of FIG. 5A. Schottky diode 500 is similar to Schottky diode 200 and, as a result, utilizes the same reference numerals to designate the structures which are common to both diodes.

As shown in FIGS. 5A-5C, diode 500 differs from diode 200 in that diode 500 utilizes a silicon-on-insulator (SOI) structure 510 in lieu of semiconductor material 210. SOI structure 510 includes a (p-type or n-type) handle region 512, an insulation layer 514, and a thin n-type silicon film 516. Film 516 is isolated from handle region 512 by insulation layer 514, and from adjacent devices by STI ring 212.

In addition, because diode 500 is completely isolated, the p+ regions 220 and 222 are omitted. Further, during the formation of the metal strips 240 and 242, the n+ regions of the n-type strips 214 and 216 are consumed, leaving only a portion of the LDD regions of the n-type strips 214 and 216. Similarly, the formation of metal region 244 also consumes all of the underlying film 516. Schottky diode 500 operates the same as Schottky diode 200 except that the metal-silicon junction of diode 500 is no longer principally below metal region 244, but instead lies along the side walls S of metal region 244.

Figure 6A:
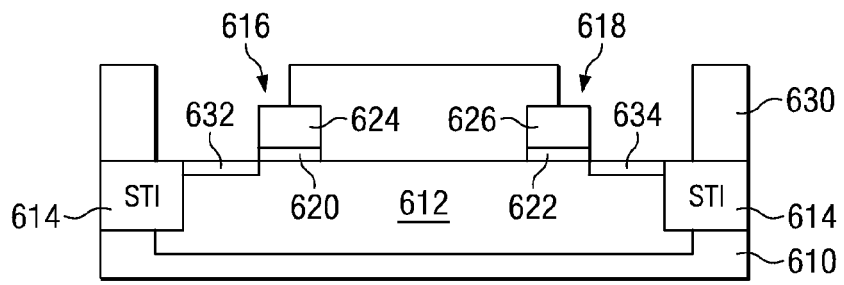
FIGS. 6A-6F and FIGS. 7A-7F are a series of cross-sectional views that illustrate an example of a method of forming Schottky diode 200 in accordance with the present invention.
Figure 6B:
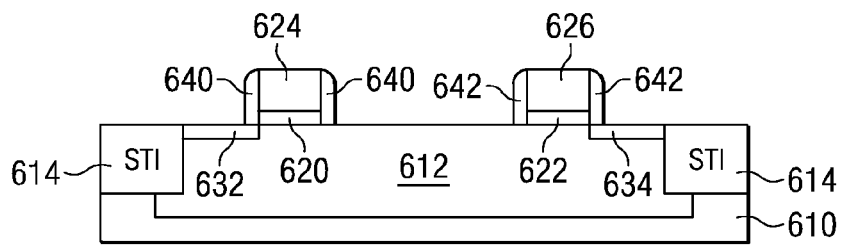
Figure 6C:
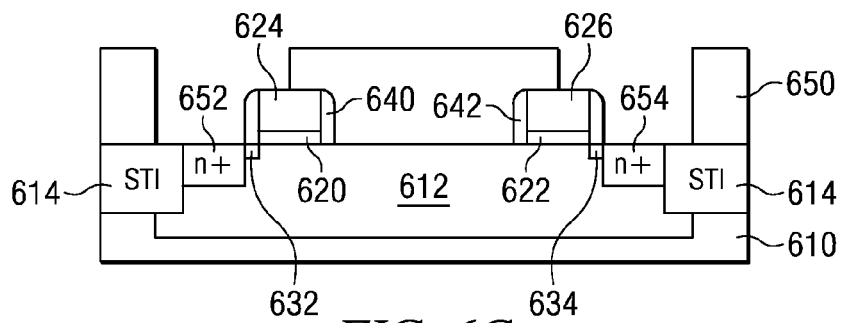
Figure 6D:
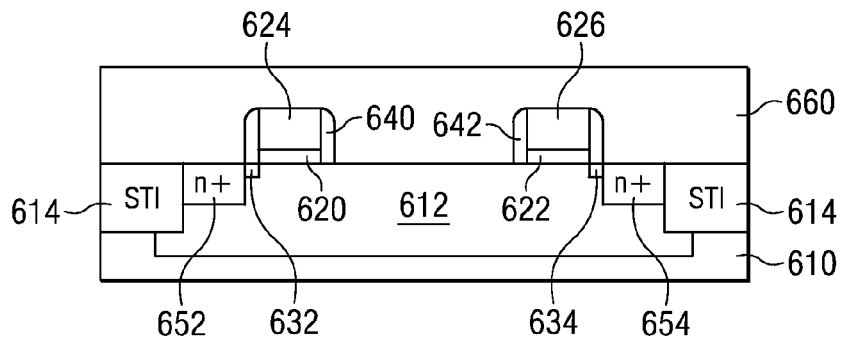
Figure 6E:
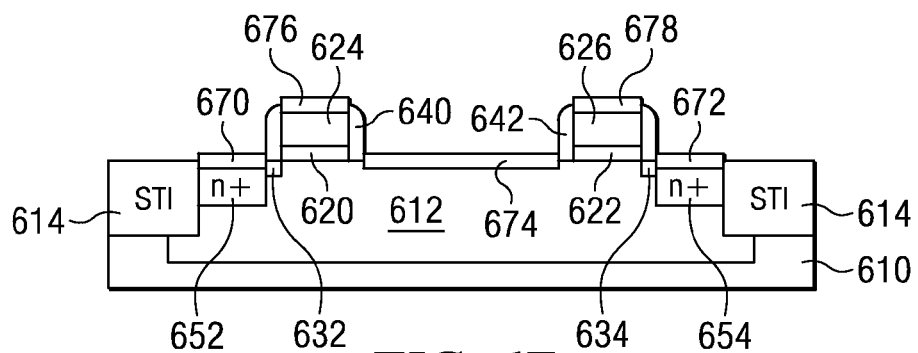
Figure 6F:
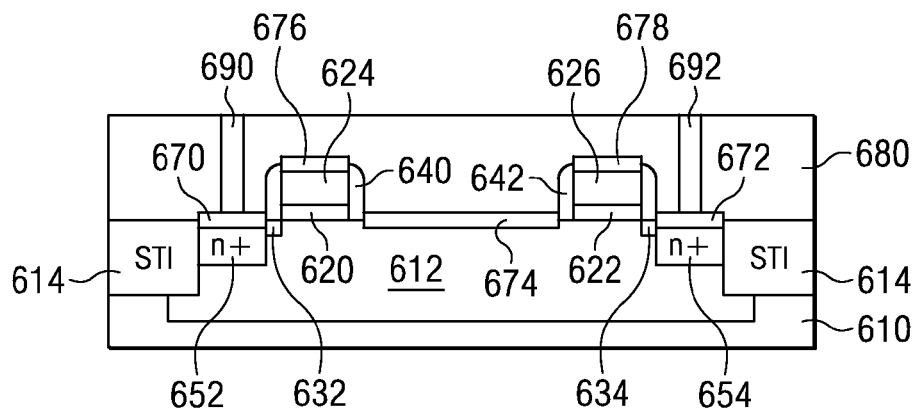
Figure 7A:
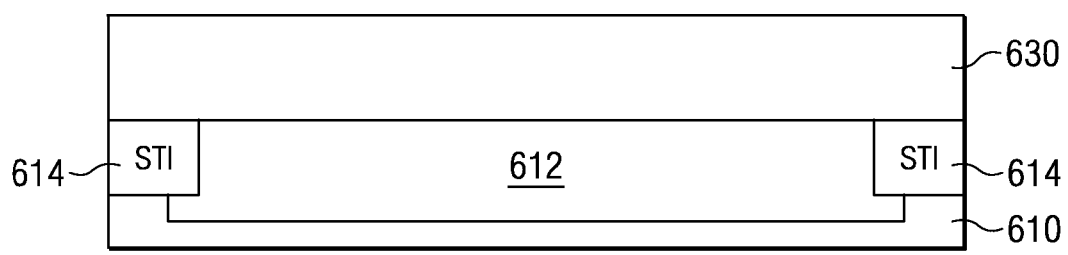

FIGS. 6A-6F and FIGS. 7A-7F show a series of cross-sectional views that illustrate an example of a method of forming Schottky diode 200 in accordance with the present invention. FIGS. 6A-6F are taken along line 2B-2B of FIG. 2A, while FIGS. 7A-7F are taken along line 2C-2C of FIG. 2A. As shown in FIGS. 6A and 7A, the method utilizes a conventionally-formed wafer that includes a p-type substrate 610, an n-well 612 that is formed in substrate 610, and a shallow trench isolation (STI) ring 614 that is formed in substrate 610 and n-well 612.

In addition, the method utilizes a transistor stack 616 and a transistor stack 618 that are formed in a conventional fashion at the same time that a number of adjacent MOS transistors are formed. Transistor stack 616 includes a first non-conductive strip 620 that is formed on the top surface of n-well 612, while transistor stack 618 includes a second non-conductive strip 622 that is formed on the top surface of n-well 612. The non-conductive strips 620 and 622 can be formed at the same time that the gate oxide regions of the adjacent MOS transistors are formed.

Further, transistor stack 616 includes a first conductive strip 624 that is formed on the top surface of first non-conductive strip 620, while transistor stack 618 includes a second conductive strip 626 that is formed on the top surface of second non-conductive strip 622. The conductive strips 624 and 626 can be formed from polysilicon at the same time that the poly gates of the adjacent MOS transistors are formed.

As further shown in FIGS. 6A and 7A, the method begins by forming and patterning a mask 630 that touches the top surface of n-well 612. Mask 630 protects the region of n-well 612 that lies between the first and second conductive strips 624 and 626. After mask 630 has been patterned, an n-type dopant is implanted into n-well 612 through the openings in mask 630 to form a first n-type strip 632 and a second n-type strip 634. (The implant can optionally implant all of the top surfaces of the conductive strips 624 and 626.) The first and second n-type strips 632 and 634 can be formed at the same time that the LDD regions of the adjacent NMOS transistors are formed. Following the implant, mask 630 is removed.

Figure 7B:
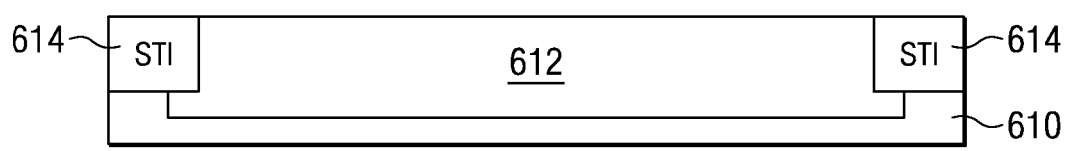

Following the removal of mask 630, a layer of oxide is deposited on n-well 612 and the first and second conductive strips 624 and 626. As shown in FIGS. 6B and 7B, the deposited oxide is then anisotropically etched back to remove the deposited oxide from the top surfaces of the first and second conductive strips 624 and 626, and thereby form a first side wall spacer 640 and a second side wall spacer 642.

First side wall spacer 640 touches the side walls of non-conductive strip 620 and conductive strip 624, while second side wall spacer 642 touches the side walls of non-conductive strip 622 and conductive strip 626. The first and second side wall spacers 640 and 642 can be formed at the same time that the side wall spacers of the adjacent MOS transistors are formed.

Figure 7C:
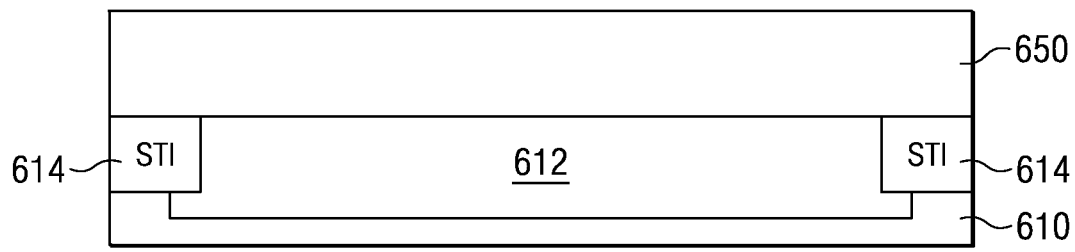

As shown in FIGS. 6C and 7C, after the spacers 640 and 642 have been formed, a mask 650 is formed and patterned to touch the top surface of n-well 612. Mask 650 protects the region of n-well 612 that lies between the first and second conductive strips 624 and 626. After mask 650 has been patterned, an n-type dopant is implanted into n-well 612 through the openings in mask 650 to form a first n-type strip 652 and a second n-type strip 654. (The implant can optionally implant all of the top surfaces of the conductive strips 624 and 626.) The first and second n-type strips 652 and 654 can be formed at the same time that the n+ regions of the adjacent NMOS transistors are formed. Following the implant, mask 650 is removed.

Figure 7D:
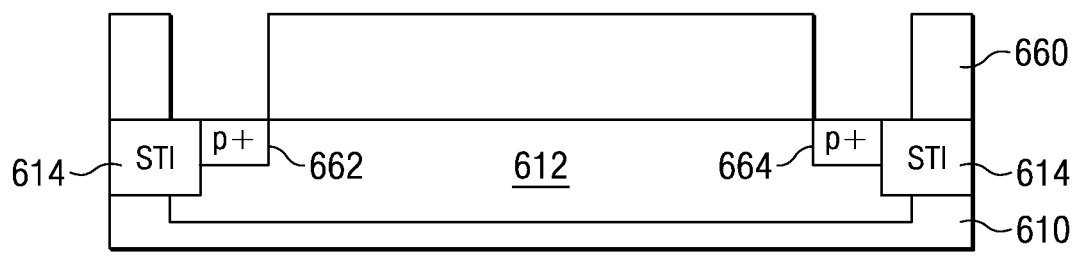

As shown in FIGS. 6D and 7D, following the removal of mask 650, a mask 660 is formed and patterned to touch the top surface of n-well 612. Mask 660 protects a portion of the region of n-well 612 that lies between the first and second conductive strips 624 and 626. After mask 660 has been patterned, a p-type dopant is implanted into n-well 612 through the openings in mask 660 to form a first p-type region 662 and a second p-type region 664.

By reducing the widths of the first and second p-type regions 662 and 664, the capacitance is reduced which, in turn, improves the switching speed of diode 200. The first and second p-type regions 662 and 664 can be formed at the same time that the p+ regions of the adjacent PMOS transistors are formed. Following the implant, mask 660 is removed.

Following the removal of mask 660, the exposed surfaces are thoroughly cleaned, and a layer of metal, such as cobalt, is deposited on n-well 612, STI ring 614, the first and second conductive strips 624 and 626, the first and second side wall spacers 640 and 642, the first and second n-type strips 652 and 654, and the first and second p-type regions 662 and 664. Cobalt is commonly used in advanced (e.g., 0.25 micron) CMOS processes, and has a lower sheet resistance than platinum. Platinum also suffers from problems with small photo dimensions such as narrow gates.

Figure 7E:
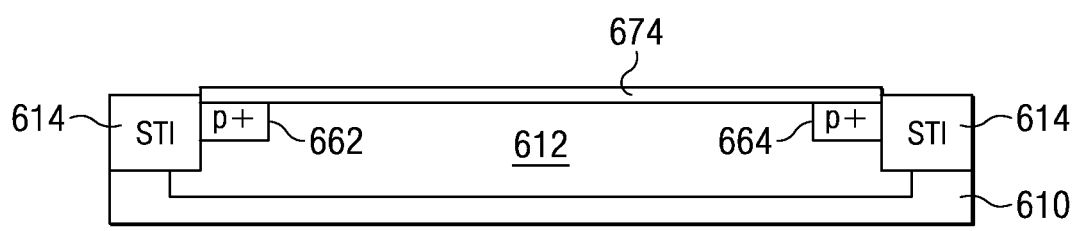

As shown in FIGS. 6E and 7E, the layer of metal is then reacted in a conventional way to form a metal silicide strip 670 that touches the top surface of first n-type strip 652, a metal silicide strip 672 that touches the top surface of second n-type strip 654, a metal silicide region 674 that touches the top surface of n-well 612 and the p-type regions 662 and 664, a metal silicide strip 676 that touches the top surface of conductive strip 624, and a metal silicide strip 678 that touches the top surface of conductive strip 626.

Metal silicide does not form on the STI ring 614 and the side wall spacers 640 and 642, and the layer of metal is removed from the STI ring 614 and the side wall spacers 640 and 642 in a conventional manner following the formation of the metal silicide strips 670, 672, 676, and 678, and the metal silicide region 674. U.S. Pat. No. 6,255,227 B1 issued on Jul. 3, 2001 to Donaton et al, which is hereby incorporated by reference, discloses the formation of cobalt silicide, including approaches to thoroughly clean a wafer before the metal is deposited.

The metal silicide strips 670, 672, 676, and 678, and the metal silicide region 674 can be formed at the same time that the adjacent MOS transistors are silicided. Thus, one of the advantages of the present invention is that a Schottky diode can be formed in a self-aligned process as part of a standard CMOS process flow.

Figure 7F:
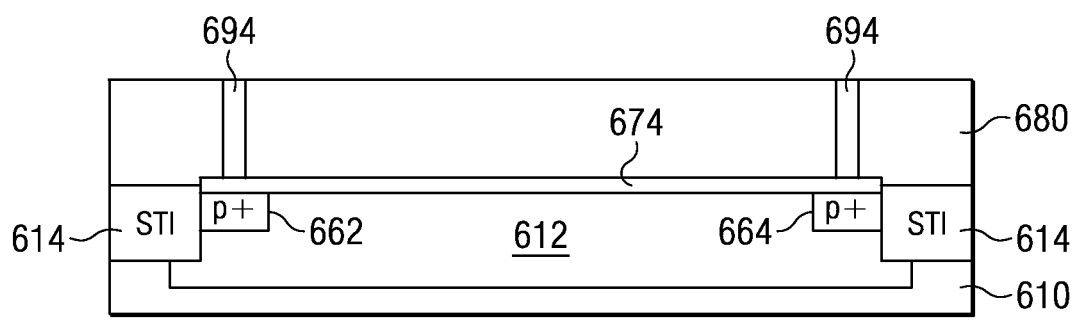

As shown in FIGS. 6F and 7F, after the metal silicide strips 670, 672, 676, and 678, and the metal silicide region 674 have been formed, a non-conductive layer 680 is formed on STI ring 614, the first and second side wall spacers 640 and 642, the metal silicide strips 670, 672, 676, and 678, and the metal silicide region 674. In addition, a number of first contacts 690, a number of second contacts 692, a number of third contacts 694, a number of fourth contacts, and a number of fifth contacts are formed in a conventional manner.

The first contacts 690 extend through non-conductive layer 680 to make electrical connections with metal silicide strip 670, the number of second contacts 692 extend through non-conductive layer 680 to make electrical connections with metal silicide strip 672, the number of third contacts 694 extend through non-conductive layer 680 to make electrical connections with metal silicide region 674, the number of fourth contacts extend through non-conductive layer 680 to make electrical connections with metal silicide strip 676, and the number of fifth contacts extend through non-conductive layer 680 to make electrical connections with metal silicide strip 678.

Figure 8:
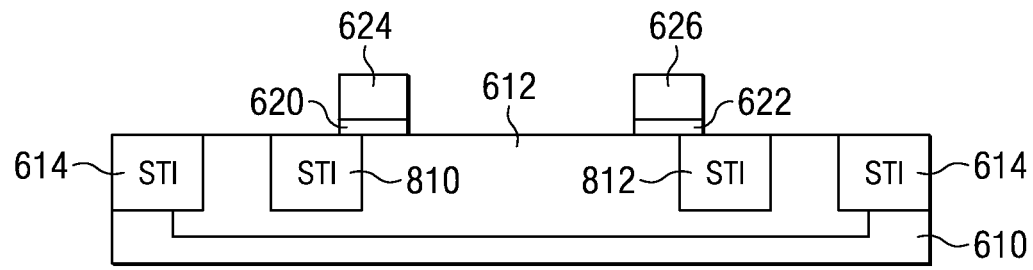
FIG. 8 is a cross-sectional view taken along line 3B-3B of FIG. 3A illustrating a method of forming Schottky diode 300 in accordance with the present invention.

FIG. 8 shows a cross-sectional view taken along line 3B-3B of FIG. 3A that illustrates a method of forming Schottky diode 300 in accordance with the present invention. Schottky diode 300 is formed in the same manner that Schottky diode 200 is formed except that, as shown in FIG. 8, the method utilizes a conventionally-formed wafer that, in addition to including p-type substrate 610, n-well 612, and STI ring 614, also includes an STI strip 810 and an STI strip 812.

The STI strips 810 and 812 are conventionally formed in n-well 612 at the same time that STI ring 614 is formed. Further, the non-conductive strip 620 and the conductive strip 624 are formed to lie over a portion of STI strip 810, and the non-conductive strip 622 and the conductive strip 626 are formed to lie over a portion of STI strip 812. In addition, although LDD regions are initially formed, the STI strips 810 and 812 prevent the formation of LDD regions under the to-be-formed side wall spacers. As a result, the LDD regions are eliminated by the subsequent formation of the n+ regions 652 and 654.

Figure 9:
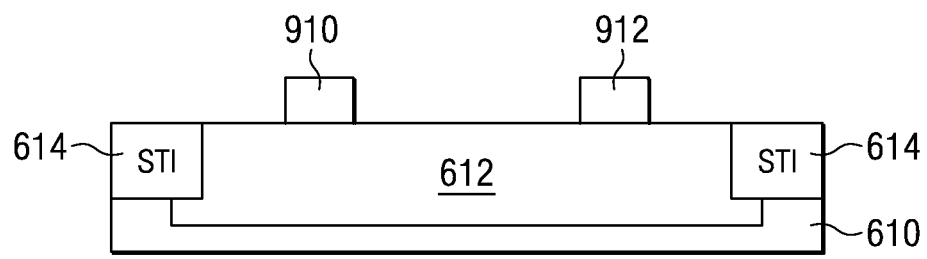
FIG. 9 is a cross-sectional view taken along line 4B-4B of FIG. 4A illustrating a method of forming Schottky diode 400 in accordance with the present invention.

FIG. 9 shows a cross-sectional view taken along line 4B-4B of FIG. 4A that illustrates a method of forming Schottky diode 400 in accordance with the present invention. Schottky diode 400 is formed in the same manner that Schottky diode 200 is formed except that, as shown in FIG. 9, a non-conductive strip 910 and a non-conductive strip 912 are utilized in lieu of transistor stack 616 and transistor stack 618, respectively.

The non-conductive strips 910 and 912 are formed in a conventional fashion. For example, a layer of oxide, or layers of oxide and nitride, can be deposited and patterned to form the strips 910 and 912. As a result, the method begins by forming the first and second n-type strips 632 and 634 to lie adjacent to the non-conductive strips 912 and 914, respectively, rather than adjacent to the non-conductive strips 620 and 622, respectively.

Figure 10:
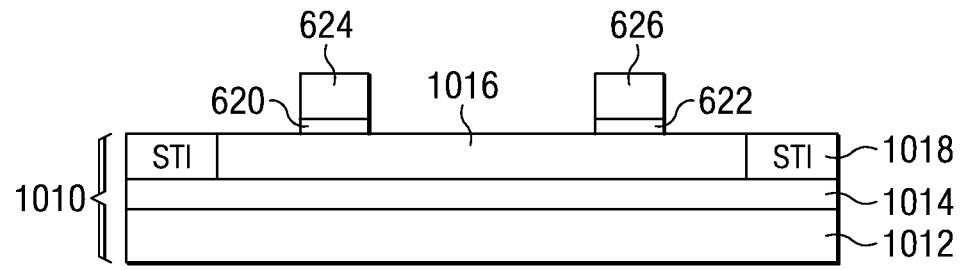
FIG. 10 is a cross-sectional view taken along line 5B-5B of FIG. 5A illustrating a method of forming Schottky diode 500 in accordance with the present invention.

FIG. 10 shows a cross-sectional view taken along line 5B-5B of FIG. 5A that illustrates a method of forming Schottky diode 500 in accordance with the present invention. Schottky diode 500 is formed in the same manner that Schottky diode 200 is formed except that, as shown in FIG. 10, the method utilizes a conventionally-formed SOI wafer 1010 in lieu of the wafer used to form diodes 200, 300, and 400.

SOI wafer 1010, in turn, includes a (p-type or n-type) handle region 1012, an insulation layer 1014, and a thin n-type silicon film 1016. Film 1016 is isolated from handle region 1012 by insulation layer 1014. An STI region 1018 is also conventionally formed in film 1016 to laterally isolate adjacent devices.

In addition, because each device is fully isolated, the implant illustrated in FIGS. 6D and 7D that is used to form the p+ regions 662 and 664 is omitted. Further, because film 1016 is thin, the reaction illustrated in FIGS. 6E and 7E that forms the metal silicide strips 670 and 672 consumes the n+ regions 652 and 654, leaving only a portion of the LDD regions 632 and 634. Similarly, the formation of metal silicide region 674 consumes the underlying film 1016.

It should be understood that the above descriptions are examples of the present invention, and that various alternatives of the invention described herein may be employed in practicing the invention. Therefore, it is intended that the following claims define the scope of the invention and that structures and methods within the scope of these claims and their equivalents be covered thereby.

What is claimed is:

1. A method of forming a Schottky diode in a semiconductor structure that includes an n-type region, the n-type region having a dopant concentration, the method comprising:
   implanting the semiconductor structure to form a first n-type strip and a second n-type strip in the semiconductor structure, the first n-type strip and the second n-type strip each having a dopant concentration that is greater than the dopant concentration of the n-type region, the second n-type strip being spaced apart from the first n-type strip, no doped region with an n-type and a dopant concentration greater than the dopant concentration of the n-type region touching both the first n-type strip and the second n-type strip;
   depositing a layer of metal; and
   reacting the layer of metal to form a first metal strip that touches a top surface of the first n-type strip, a second metal strip that touches a top surface of the second n-type strip, and a metal region that touches the semiconductor structure, lies laterally between the first metal strip and the second metal strip, and spaced apart from the first metal strip and the second metal strip.

2. The method of claim 1 and further comprising forming a first side wall spacer that touches the first n-type strip and a second side wall spacer that touches the second n-type strip.

3. The method of claim 2 and further comprising:
   implanting the semiconductor structure to form a first p-type region located in the semiconductor structure, the first p-type region lying laterally between the first n-type strip and the second n-type strip; and
   implanting the semiconductor structure to form a second p-type region located in the semiconductor structure, the second p-type region lying laterally between the first n-type strip and the second n-type strip, and being spaced apart from the first p-type region such that no p-type region touches both the first p-type region and the second p-type region.

4. The method of claim 3 wherein the semiconductor structure includes:
   a first non-conductive strip that touches a top surface of the semiconductor structure;
   a second non-conductive strip that touches the top surface of the semiconductor structure, the second non-conductive strip being spaced apart from the first non-conductive strip;
   a first conductive strip that touches a top surface of the first non-conductive strip; and
   a second conductive strip that touches a top surface of the second non-conductive strip.

5. The method of claim 3 wherein the semiconductor structure includes:
   a first non-conductive strip that touches a top surface of the semiconductor structure; and
   a second non-conductive strip that touches the top surface of the semiconductor structure, the second non-conductive strip being spaced apart from the first non-conductive strip;
   and further comprising forming a non-conducting layer that touches the first non-conductive strip, the second non-conductive strip, the first metal strip, the second metal strip, and the metal region, no conductive member lying between the non-conducting layer and any portion of the first non-conductive strip, no conductive member lying between the non-conducting layer and any portion of the second non-conductive strip.

6. The method of claim 4 wherein the semiconductor structure includes an insulation layer, a first n-type region that touches the insulation layer, and a second n-type region that touches the insulation layer, a bottom surface of the metal region touching the insulation layer.

7. The method of claim 4 wherein the semiconductor structure includes:
   an STI ring that touches the first n-type strip, the second n-type strip, the first p-type region, and the second p-type region;
   a first STI strip that touches the semiconductor structure, the first n-type strip lying touching the first STI strip and the STI ring; and
   a second STI strip that touches the semiconductor structure, the second n-type strip lying touching the second STI strip and the STI ring.

* * * * *